United States Patent
Willwerth et al.

(10) Patent No.: US 8,270,141 B2
(45) Date of Patent: Sep. 18, 2012

(54) ELECTROSTATIC CHUCK WITH REDUCED ARCING

(75) Inventors: Michael D. Willwerth, Campbell, CA (US); David Palagashvili, Mountain View, CA (US); Douglas A. Buchberger, Jr., Livermore, CA (US); Michael G. Chafin, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 186 days.

(21) Appl. No.: 12/884,967

(22) Filed: Sep. 17, 2010

(65) Prior Publication Data

US 2011/0157760 A1 Jun. 30, 2011

Related U.S. Application Data

(60) Provisional application No. 61/263,290, filed on Nov. 20, 2009.

(51) Int. Cl.
 *H02T 23/00* (2006.01)
(52) U.S. Cl. ............... 361/234; 361/233; 156/345.1; 279/128; 269/8; 269/903
(58) Field of Classification Search .......... 361/234, 361/233; 279/128; 269/8, 903; 156/345.1
See application file for complete search history.

(56) References Cited

U.S. PATENT DOCUMENTS

| | | | |
|---|---|---|---|
| 5,805,408 A * | 9/1998 | Maraschin et al. | 361/234 |
| 6,108,189 A | 8/2000 | Weldon et al. | |
| 6,151,203 A | 11/2000 | Shamouilian et al. | |
| 6,847,516 B2 * | 1/2005 | Kwon et al. | 361/234 |
| 6,944,006 B2 * | 9/2005 | Zheng et al. | 361/234 |
| 7,175,737 B2 * | 2/2007 | Sago et al. | 156/345.53 |
| 7,764,483 B2 * | 7/2010 | Kim et al. | 361/234 |
| 2004/0023047 A1 | 2/2004 | O'Donnell et al. | |
| 2007/0258186 A1 | 11/2007 | Matyushkin et al. | |
| 2009/0044751 A1 | 2/2009 | Park et al. | |
| 2009/0200269 A1 | 8/2009 | Kadkhodayan et al. | |

OTHER PUBLICATIONS

International Search Report and Written Opinion mailed Jul. 29, 2011 for PCT Application No. PCT/US2010/057170.

* cited by examiner

*Primary Examiner* — Patrick Salce
(74) *Attorney, Agent, or Firm* — Moser Taboada; Alan Taboada

(57) ABSTRACT

Embodiments of electrostatic chucks are provided herein. In some embodiments, an electrostatic chuck may include a body having a notched upper peripheral edge, defined by a first surface perpendicular to a body sidewall and a stepped second surface disposed between the first surface and a body upper surface, and a plurality of holes disposed through the body along the first surface; a plurality of fasteners disposed through the plurality of holes to couple the body to a base disposed beneath the body; a dielectric member disposed above the body upper surface to electrostatically retain a substrate; an insulator ring disposed about the body within the notched upper peripheral edge and having a stepped inner sidewall that mates with the stepped second surface to define a non-linear interface therebetween; and an edge ring disposed over the insulator ring, the non-linear interface limiting arcing between the edge ring and the fastener.

20 Claims, 2 Drawing Sheets

ELECTROSTATIC CHUCK WITH REDUCED ARCING

CROSS-REFERENCE TO RELATED APPLICATIONS

This application claims benefit of U.S. provisional patent application Ser. No. 61/263,290, filed Nov. 20, 2010, which is herein incorporated by reference.

FIELD

Embodiments of the present invention generally relate to processing equipment, and more specifically to electrostatic chucks.

BACKGROUND

An electrostatic chuck (ESC) is often used to electrostatically retain a substrate on a substrate support. In some configurations, the electrostatic chuck or alternatively, the substrate support including the electrostatic chuck, is utilized to provide bias power (e.g., radio frequency (RF) current or alternating current (AC)) to the substrate support in addition to direct current (DC) used to retain the substrate on the ESC.

The inventors have discovered that arcing can occur in some electrostatic chucks when RF bias power is applied to the chuck. For example, arcing may occur across air gaps between conductive components of the ESC.

Accordingly, the inventors have provided an improved electrostatic chuck that can reduce or eliminate arcing between conductive components in the chuck.

SUMMARY

Embodiments of an electrostatic chuck are provided herein. In some embodiments, an electrostatic chuck includes a body having a notched upper peripheral edge, defined by a first surface perpendicular to a sidewall of the body and a stepped second surface disposed between the first surface and an upper surface of the body, and a plurality of holes disposed through the body along the first surface of the notched upper peripheral edge; a plurality of fasteners disposed through respective ones of the plurality of holes to couple the body to a base disposed beneath the body; a dielectric member disposed above the upper surface of the body to electrostatically retain a substrate disposed thereon; an insulator ring disposed about the body and within the notched upper peripheral edge, the insulator ring having a stepped inner sidewall that mates with the stepped second surface of the notch to define a non-linear interface therebetween; and an edge ring disposed over the insulator ring, wherein the non-linear interface limits arcing between the edge ring and the fastener when RF power is applied to the electrostatic chuck. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
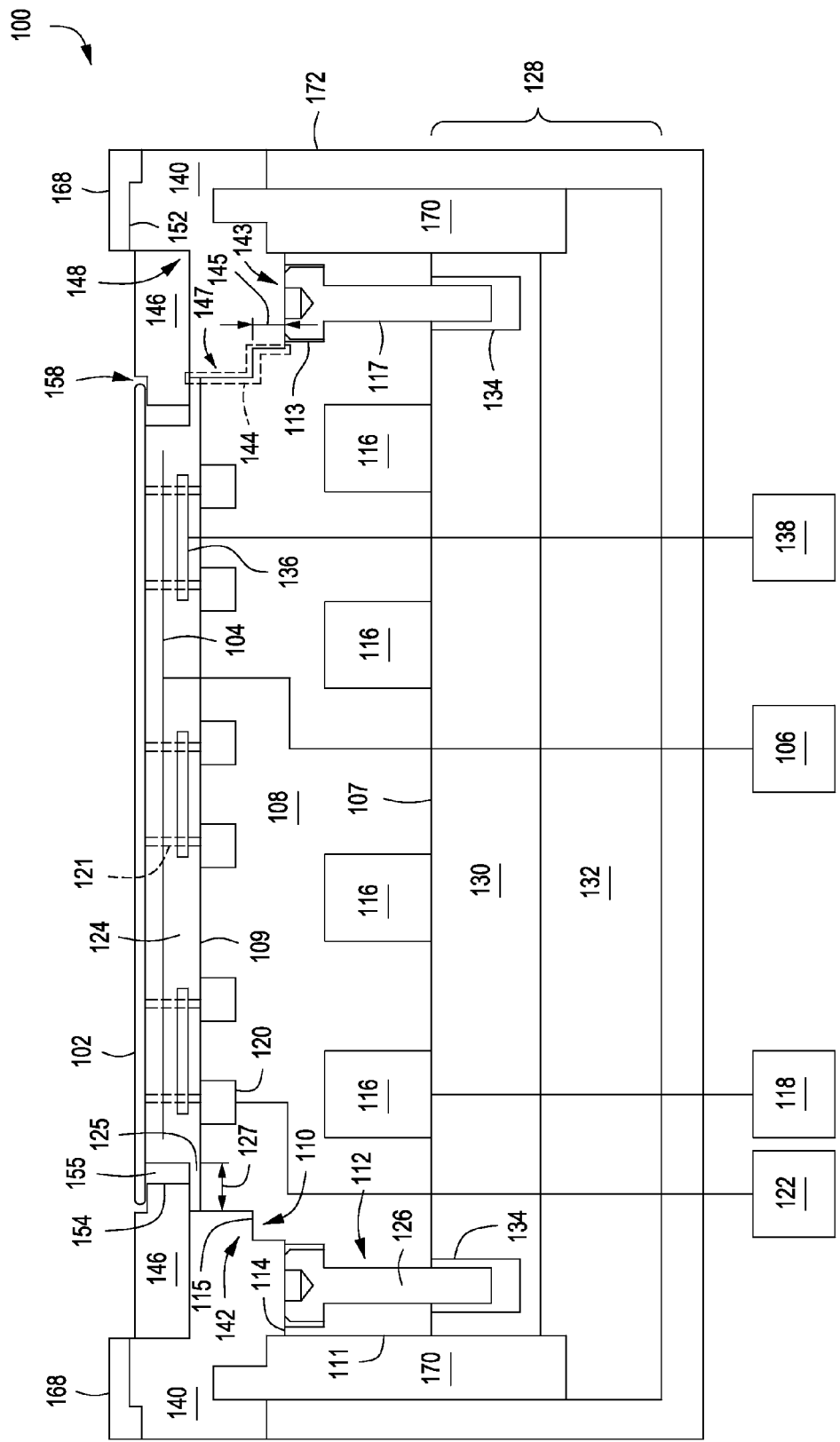
FIG. 1 depicts a schematic side view of an electrostatic chuck in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Figure 2:
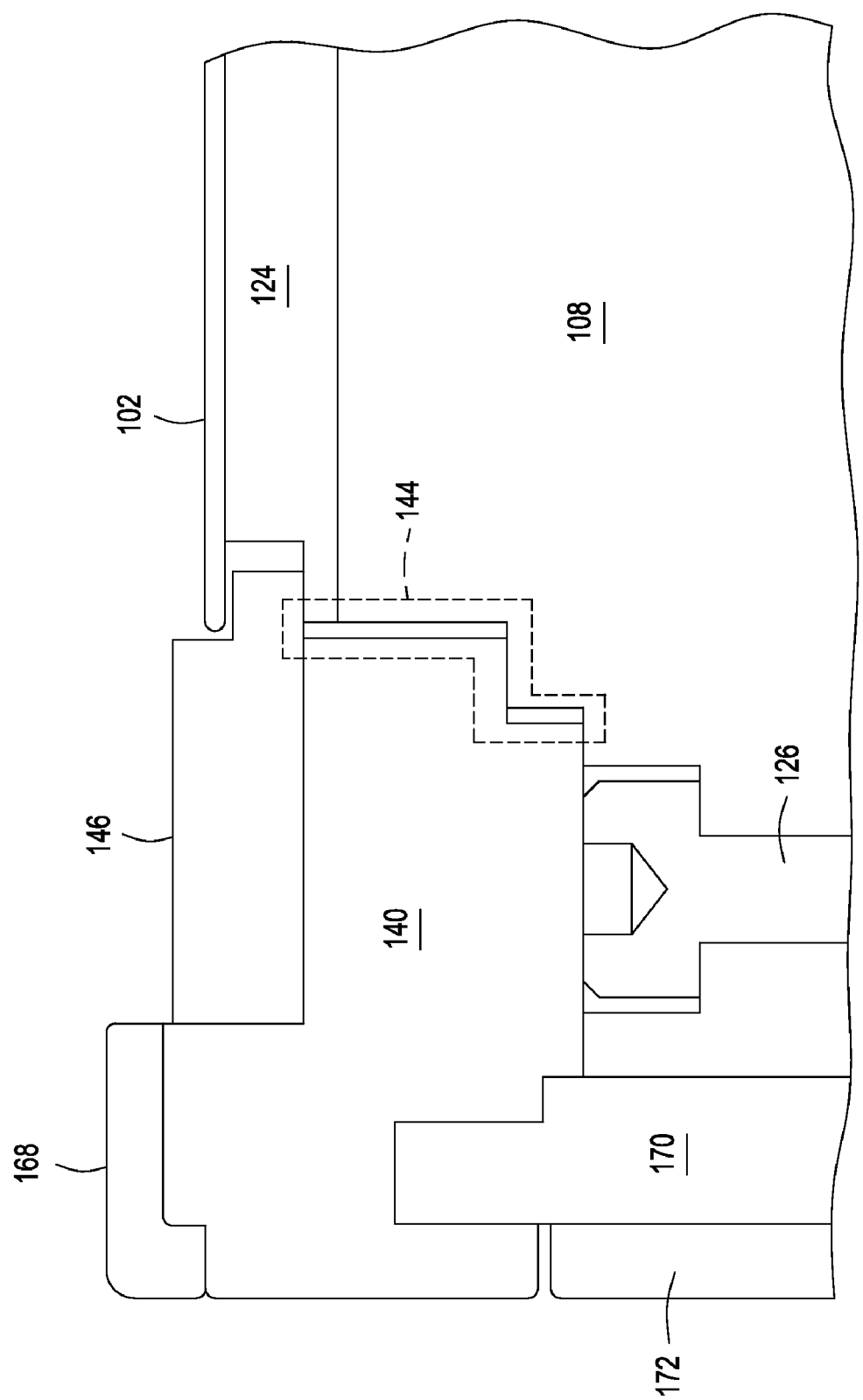
FIG. 2 depicts a partial schematic side view of the electrostatic chuck of FIG. 1 in accordance with some embodiments of the present invention.

Embodiments of electrostatic chucks that may advantageously reduce or prevent arcing between conductive components of the chuck are provided herein. FIG. 1 depicts a schematic side view of an electrostatic chuck (ESC) in accordance with some embodiments of the present invention. FIG. 2 depicts a detailed schematic side view of the electrostatic chuck (ESC) of FIG. 1. The electrostatic chuck 100 is utilized to retain a substrate 102 thereon by means of a DC voltage supplied to an electrode 104 by a DC power supply 106. The electrostatic chuck may be disposed in a process chamber configured for any suitable process requiring the retention of a substrate. For example, suitable processes may include plasma, etch, nitridation, oxidation processes, or the like. Examples of suitable processing apparatus that may advantageously benefit from modification in accordance with embodiments of the present invention include processing apparatus such as plasma reactors including but not limited to any of the PRODUCER® line of processing equipment available from Applied Materials, Inc. of Santa Clara, Calif. The above listing of processing equipment is illustrative only, and other plasma reactors, and non-plasma equipment (such as CVD reactors, or other processing equipment) may also be suitably modified in accordance with the present teachings.

The electrostatic chuck 100 includes a body 108 having an upper surface 109 to support a dielectric member 124 configured to electrostatically retain a substrate 102 disposed thereon. The body has a stepped, or notched upper peripheral edge 110. A plurality of holes 112 are disposed through the body 108 along a first surface 114 of the notched upper peripheral edge 110. The first surface may be disposed substantially perpendicular to a central axis of the electrostatic chuck (e.g., substantially parallel to the support surface of the chuck). The body 108 may comprise an electrically conductive material, such as aluminum (Al), titanium (Ti), or the like.

The body 108 may include one or more heat transfer fluid conduits 116 disposed proximate a lower surface 107 of the body 108. The heat transfer fluid conduits 116 may be coupled to a heat transfer fluid source 118 to supply heat transfer fluid to all adjoining conduits 116. The heat transfer fluid may be flowed through the conduits 116 to control the temperature and/or temperature profile of the electrostatic chuck during use.

The body 108 may further comprise a plurality of heat transfer gas conduits 120 disposed proximate the upper surface 109 of the body 108. The heat transfer gas conduits 120 may be interconnected such that a heat transfer gas source 122 may be coupled to a single conduit 120 (as shown), such that heat transfer gas can be supplied to all adjoining conduits 120. Alternatively, the heat transfer gas source 122 may be coupled to each conduit 120 if the conduits are not interconnected (not shown). The heat transfer gas provided by the heat transfer gas source may be helium (He) or the like. In some embodiments, the heat transfer gas conduits 120 may extend through the dielectric member 124 (as shown in phantom 121) to provide the heat transfer gas to the backside of the substrate 102 disposed atop the dielectric member 124. Alternatively, the dielectric member 124 may comprise a porous material, such as a ceramic or the like, whereby allowing the heat transfer gas to permeate therethrough to contact the backside of the substrate 102.

The notched upper peripheral edge 110 of the body 108 is defined by the first surface 114 perpendicular to a sidewall 111 of the body 108 and a stepped second surface 115 disposed between the first surface 114 and the upper surface 109 of the body 108. Each hole 112 disposed along the first surface 114 of the notched upper peripheral edge 110 may be any suitable shape to accommodate a respective one of a plurality of fasteners 126 disposed therethrough. For example, as illustrated in FIG. 1, each hole 112 may comprise a first portion 113 proximate the first surface 114 of the notched upper peripheral edge 100 and a second portion 117 disposed between the first portion 113 and the lower surface 107 of the body 108. The first portion 113 may have a larger diameter than second portion 117, for example, to form a counterbore to allow the head of each fastener 126 (e.g., when the fastener is a bolt, screw, or the like) to be recessed below the first surface 114 of the notched upper peripheral edge 110 of the body 108.

Each fastener of the plurality of fasteners 126 are disposed through a respective one of the plurality of holes 112 to couple the body 108 to a base 128 disposed beneath the body 108. Each fastener may be a screw, bolt, clamp, or the like. In some embodiments, the fastener is a screw. Each fastener may comprise titanium (Ti) or the like. In some embodiments, the fastener comprises titanium (Ti). In some embodiments, a washer (not shown) may be disposed about each fastener 126, for example, resting at the base of the first portion 113 of each hole 112. The washer may comprise the same material as the fastener 126. In some embodiments, the washer is titanium (Ti).

The base 128 may be unitary or may include a plurality of components, such as an upper member 130 and a lower member 132 (as shown). In some embodiments, the lower member 132 may be larger in diameter than the upper member 130 and have the upper member 130 disposed and centered thereon. The upper and lower members may be fabricated from the same or different materials. In some embodiments, the upper and lower members may be fabricated from electrically conductive materials, such as aluminum, steel, stainless steel, titanium, or the like. In some embodiments, the lower member 132 comprises ceramic, quartz, polyetherimide (such as ULTEM®), or the like. The upper member 130 may rest atop the lower member 132, or the upper and lower members may be bonded, for example, by a bonding layer. In some embodiments, the base, or the upper member 130 of the base, may include a plurality of second holes 134 configured to receive and retain a portion of each fastener 126 Each second hole 134 may be threaded to retain each fastener 126 or a threaded insert may be provided within each hole 134 to retain to retain each fastener 126.

Returning to the upper portions of the ESC 100, the dielectric member 124 is disposed above the upper surface 109 of the body 108 to electrostatically retain the substrate 102 during use. The dielectric member may comprise any suitable dielectric material, such as ceramic, aluminum nitride, or the like or a conductive or dielectric material that is flame spray coated with a dielectric coating. The dielectric member 124 may include an electrode 104 used for chucking the substrate 102 disposed within the dielectric member 124. The electrode 104 may be one continuous piece, as illustrated, or may comprise several separate or electrically connected portions disposed within the dielectric layer 124. In some embodiments one or more bias electrodes 136 may be disposed within the dielectric member 124 to supply bias power, for example, RF power to control ion energy of a plasma used to process the substrate 102. Like the electrode 104, the electrodes 136 may be one single electrode, or a plurality of separate or electrically connected electrodes for supplying RF power. The electrodes 136 may be disposed below or above the electrode 104. The electrodes 136 may be coupled to an RF power source 138 via a match network or any suitable impedance matching system (not shown).

The dielectric member 124 may further comprise a lip 125 extending radially about the dielectric member from a bottom portion of the dielectric member 124 (e.g., adjacent to the upper surface 109 of the body 108). The lip 125 may extend to the peripheral edge of the upper surface 109 of the body 108 (e.g., to the radially inner edge of the notched upper peripheral edge of the body). In some embodiments, the length 127 of the lip may be between about 0.05 inch to 0.50 inches. A bonding layer (not shown) may be disposed between the upper surface 109 of the body 108 and a lower surface of the dielectric member 124 to bond the body 108 to the dielectric member 124. The bonding layer may comprise similar materials used for bonding layers as discussed above. The Inventors have discovered that when a bonding layer is used, the bonding layer may not extend fully to the peripheral edge of the upper surface 109 of the body 108. Accordingly, a portion of the lip 125 may be suspended in space instead of supported by the bonding layer. The inventors have further discovered that if the lip is excessively long, the suspended portion of the lip is more likely to chip. Accordingly, in some embodiments, the length 127 of the lip may be selected to reduce or prevent the occurrence of chipping.

The ESC 100 further includes an insulator ring 140 disposed about the body 108 and within the notched upper peripheral edge 110. The insulator ring 140 may comprise quartz or the like. In some embodiments, the insulator ring 140 comprises quartz. The insulator ring has a stepped inner sidewall 142 that mates with the stepped second surface 115 of the notched upper peripheral edge 110 to define a non-linear interface 144 therebetween. The non-linear interface 144 adds a torturous path for the plasma to the screws and breaks the line of sight from the plasma to the screws. This may reduce or prevent arcing between an edge ring 146 disposed over the insulator ring 140 and the plurality of fasteners 126 when RF power is applied to the electrostatic chuck 100. In addition, the screws are moved away (e.g., down) to minimize arcing that may otherwise result, for example, from a high density plasma.

The stepped inner sidewall 142 of the insulator ring 140 may further comprise a first portion 143 extending downward from the insulator ring 140 towards the first surface 114 of the notched upper peripheral edge 110 of the body 108. The first portion 143 may be have a length 145 of between about 0.02 inch to 1.00 inches. The stepped inner sidewall 142 may further include a second portion 147 extending laterally from the insulator ring 140 along the stepped second surface 115 of the notched upper peripheral edge 110 of the body 108. The second portion 147 may be have a length of between about 0.02 inch to 1.00 inches.

The insulator ring 140 may further include a ledge 148 disposed about an upper inner edge of the insulator ring 140. The insulator ring may have a thickness from a bottom surface of the insulator ring 140 to the ledge 148 such that the ledge 148 is disposed even with or above the lip 125 of the dielectric member 124. The edge ring 146 may be disposed on the ledge 148 of the insulator ring 140. The edge ring 146 may be fabricated from silicon (Si) or the like. An inner edge 154 of the edge ring 146 may extend inwardly towards a central axis of the electrostatic chuck and rest atop the lip 125 of the dielectric member 124. A gap 155 may exist between the inner edge 154 of the edge ring 146 and the dielectric member 124.

The edge ring 146 may further comprise a ledge 158 disposed about an upper inner edge of the edge ring 146. The peripheral edge of the substrate 102 may extend into the ledge 158 of the edge ring 146. However, ledge 158 is typically configured such that the substrate 102 does not come into contact with the edge ring 146 and is completely supported by the dielectric member 124.

Optionally, a second edge ring 168 may disposed atop an upper surface 152 of the insulator ring 140. The second edge ring 168 may be fabricated from silicon (Si) or the like. The second edge ring 168 may protect the isolator ring 140 from degradation or damage from the plasma and/or from the process environment.

Additional components of the ESC 100 may include a second insulator ring 170 circumscribing the body 108 and at least a portion of the base 128. The second insulator ring 170 may be fabricated from at least one of ceramic, quartz, silicon, silicon carbide, or the like. The second insulator ring 170 may rest atop the lower member 132 of the base 128. The second insulator ring 170 may electrically insulate the body 108 and the upper member 130 of the base 128 from an outer grounding shell 172. The grounding shell 172 may circumscribe the second insulator ring 170.

Thus, embodiments of electrostatic chucks having reduced arcing have been provided herein. The inventive electrostatic chuck advantageously reduces or prevents arcing between conductive components of the ESC.

While the foregoing is directed to embodiments of the present invention, other and further embodiments of the invention may be devised without departing from the basic scope thereof.

The invention claimed is:

1. An electrostatic chuck, comprising:
a body having a notched upper peripheral edge, defined by a first surface perpendicular to a sidewall of the body and a stepped second surface disposed between the first surface and an upper surface of the body, and a plurality of holes disposed through the body along the first surface of the notched upper peripheral edge;
a plurality of fasteners disposed through respective ones of the plurality of holes to couple the body to a base disposed beneath the body;
a dielectric member disposed above the upper surface of the body to electrostatically retain a substrate disposed thereon;
an insulator ring disposed about the body and within the notched upper peripheral edge, the insulator ring having a stepped inner sidewall that mates with the stepped second surface of the notched upper peripheral edge to define a non-linear interface therebetween; and
an edge ring disposed over the insulator ring, wherein the non-linear interface limits arcing between the edge ring and the fastener when RF power is applied to the electrostatic chuck.

2. The electrostatic chuck of claim 1, wherein the body further comprises:
a plurality of heat transfer fluid conduits disposed proximate a lower surface of the body.

3. The electrostatic chuck of claim 1, wherein the body further comprises:
a plurality of heat transfer gas conduits disposed proximate the upper surface of the body.

4. The electrostatic chuck of claim 1, wherein the body comprises an electrically conductive material.

5. The electrostatic chuck of claim 1, wherein the base further comprises:
an upper member coupled the body via the fasteners; and
a lower member disposed below the upper member.

6. The electrostatic chuck of claim 5, wherein the upper member comprises an electrically conductive material.

7. The electrostatic chuck of claim 1, further comprising:
a second insulator ring circumscribing the body and the base.

8. The electrostatic chuck of claim 7, further comprising:
a grounding shell circumscribing the second insulator ring, wherein the second insulator ring electrically insulates the grounding shell from the body and at least a portion of the base.

9. The electrostatic chuck of claim 1, wherein each fastener comprises a screw.

10. The electrostatic chuck of claim 1, the dielectric member further comprising:
a lip circumscribing the dielectric member proximate the upper surface of the body, the lip extending to the peripheral edge of the upper surface of the body.

11. The electrostatic chuck of claim 10, wherein an inner edge of the edge ring is disposed over the lip of the dielectric member.

12. The electrostatic chuck of claim 1, wherein the dielectric member further comprises:
one or more chucking electrodes disposed therein.

13. The electrostatic chuck of claim 1, wherein stepped inner sidewall of the insulator ring further comprises:
a first portion extending downward from the insulator ring towards the first surface of the notched upper peripheral edge of the body; and
a second portion extending laterally from the insulator ring along the stepped second surface of the notched upper peripheral edge of the body.

14. The electrostatic chuck of claim 1, wherein the insulator ring comprises quartz.

15. The electrostatic chuck of claim 1, wherein the edge ring is disposed within a ledge disposed in an upper inner edge of the insulator ring.

16. The electrostatic chuck of claim 15, further comprising:
a second edge ring disposed atop an upper surface of the insulator ring.

17. The electrostatic chuck of claim 16, wherein the second edge ring comprises silicon (Si).

18. The electrostatic chuck of claim 1, wherein the edge ring further comprises:
a ledge disposed about an upper inner edge of the edge ring, wherein the ledge is configured to be disposed beneath a substrate when the substrate is disposed on the dielectric member of the electrostatic chuck.

19. The electrostatic chuck of claim 18, wherein the substrate is disposed above the ledge when positioned on the electrostatic chuck and does not contact the edge ring.

20. The electrostatic chuck of claim 1, wherein the edge ring comprises silicon (Si).

* * * * *